United States Patent [19]

Merickel et al.

[11] Patent Number: 5,003,979
[45] Date of Patent: Apr. 2, 1991

[54] SYSTEM AND METHOD FOR THE NONINVASIVE IDENTIFICATION AND DISPLAY OF BREAST LESIONS AND THE LIKE

[75] Inventors: Michael B. Merickel; Ann H. Adams; James R. Brookeman, all of Charlottesville, Va.

[73] Assignee: University of Virginia, Charlottesville, Va.

[21] Appl. No.: 313,183

[22] Filed: Feb. 21, 1989

[51] Int. Cl.⁵ .............................................. A61B 5/55
[52] U.S. Cl. .............................. 128/653 A; 128/915; 364/413.13; 378/37
[58] Field of Search ....................... 128/653, 664–665, 128/736, 915, 660.09, 660.06, 660.01, 661.02; 378/37; 324/309; 364/413.13, 413.14, 413.25

[56] References Cited

U.S. PATENT DOCUMENTS

| | | | |
|---|---|---|---|
| 4,075,883 | 2/1978 | Glover | 128/661.02 |
| 4,097,845 | 6/1978 | Bacus | 364/413.08 |
| 4,515,165 | 5/1985 | Carroll | 128/664 |
| 4,543,959 | 10/1985 | Sepponen | 128/653 |
| 4,768,516 | 9/1988 | Stoddart et al. | 128/665 |
| 4,855,911 | 8/1989 | Lele et al. | 364/413.25 |

OTHER PUBLICATIONS

"Nuclear Magnetic Resonance in the Diagnosis of Breast Cancer"; Turner et al.; Radiologic Clinics of North America—vol. 26, No. 3, May 1988, pp. 673–687.
"Initial Experience with Nuclear Magnetic Resonance (NMR) Imaging of the Human Breast"; Yousef et al.; Journal of Computer Assisted Tomography; Apr. 1983, pp. 215–218.
"Magnetic Resonance Imaging in the Study of the Breast"; Radiographics; vol. 5, No. 4, Jul. 1985; pp. 631–652.
"Benign and Malignant Breast Disease: Magnetic Resonance and Radiofrequency Pulse Sequences"; Yousef et al.; AJR; 145, Jul. 1985; pp. 1–8.
"Magnetic Resonance Imaging of the Breast"; Yousef et al.; Magnetic Resonance Annual, 1986; pp. 177–195.
"Multispectral Analysis of MR Images of the Breast"; Gohagan et al.; Radiology; Jul. 1987; pp. 703–707.
"Nuclear Magnetic Resonance Imaging of the Human Breast"; Yousef et al.; RadioGraphics; vol. 4, Special Edition, Jan. 1984; pp. 113–121.
"MRI of the Female Breast, First Clinical Results"; W. Kaiser; 2nd Symposium on Progress of NMR in Medicine; pp. 67–76.
"Image Processing as Applied to Magnetic Resonance Images of Human Breast Tissue"; Adams et al.; 1982 IEEE/Ninth Annual Conference of the Engineering in Medicine and Biology Society; 1987; pp. 1–2.
"The Microcomputer in Cell and Neurobiology Research—Section 12—Serial Section Reconstruction Using CARTOS"; Kropf et al.; c. 1985; pp. 265–291.

Primary Examiner—Kyle L. Howell
Assistant Examiner—K. M. Pfaffle
Attorney, Agent, or Firm—Staas & Halsey

[57] ABSTRACT

There is disclosed an image processing, pattern recognition and computer graphics system and method for the noninvasive identification and evaluation of female breast cancer including the characteristic of the boundary thereof using multidimensional Magnetic Resonance Imaging (MRI). The system and method classifies the tissue using a Fisher linear classifier followed by a refinement to show the boundary shape and whether the surface of the carcinoma is lobulated or spiculated. The results are a high information content display which aids in the diagnosis and analysis of breast cancer and to assist in any surgical or other remedial planning. The high information content display also assists in the assessment of the effectiveness of therapies showing any reduction or increase in the size of the carcinoma.

20 Claims, 10 Drawing Sheets

MULTISPECTRAL COMPLEX IMAGE INPUT

CLASSIFICATION OF LESION

3-D RECONSTRUCTION SHAPE / VOLUME

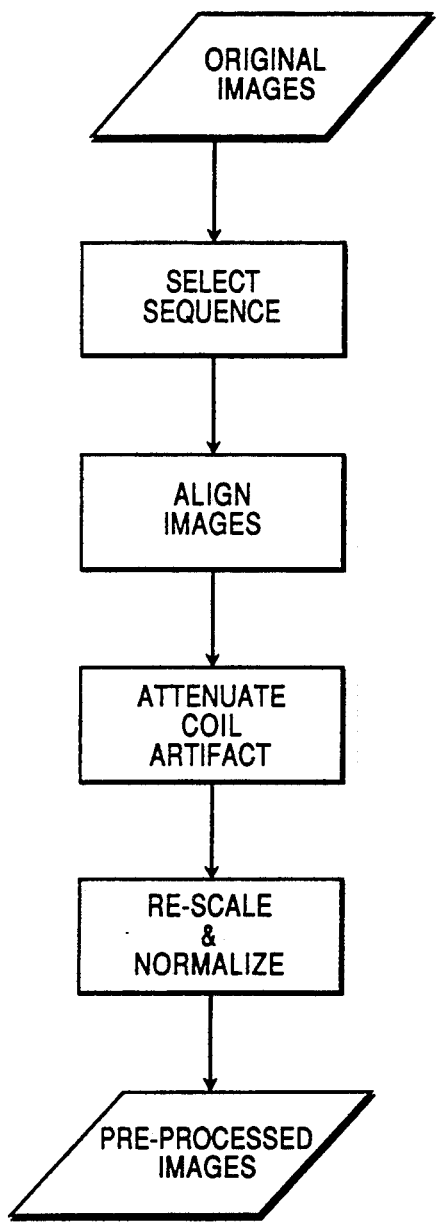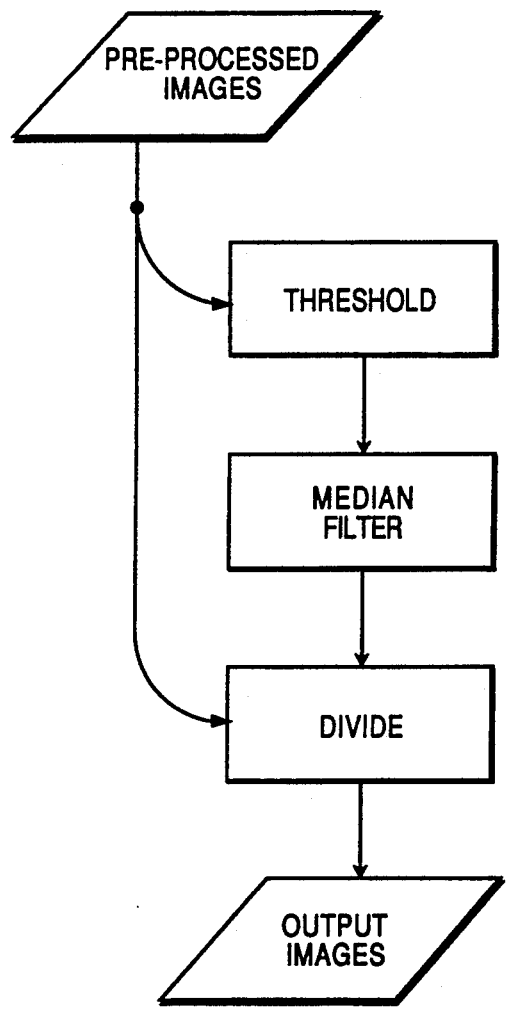

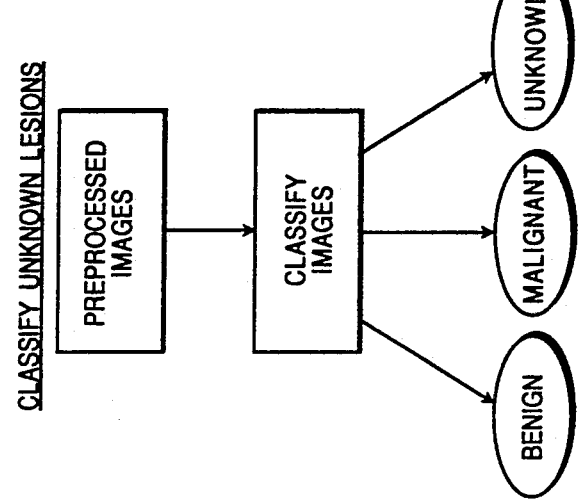
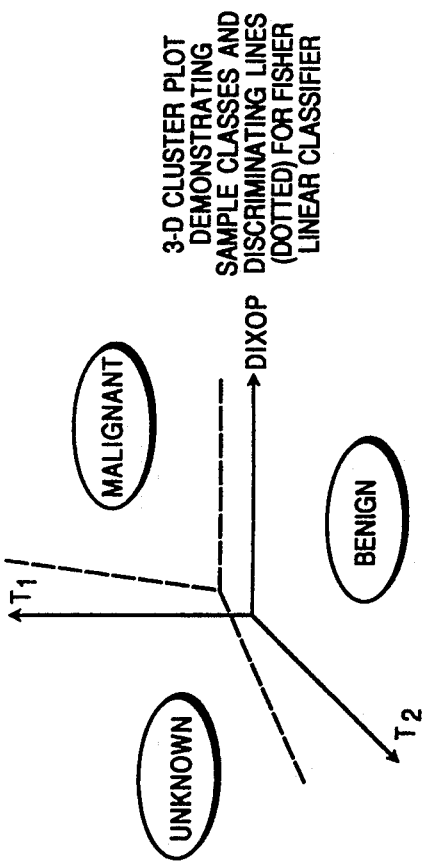
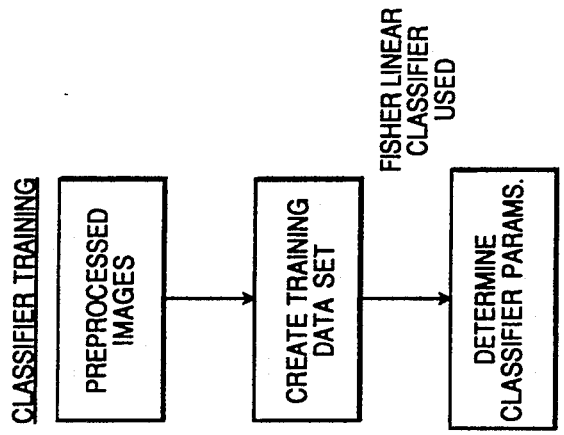

| SAMPLE LESION | DESCRIPTION |
SMOOTH EDGE
SYMMETRIC
TYPICAL OF CYST
SMALL (PERIM)$^2$ / AREA
ASYMMETRIC
SMOOTH, WELL
DEFINED EDGE
TYPICAL OF FIBROADENOMA
MEDIUM (PERIM)$^2$ / AREA
FIG. 9
LOBULATED, ILL-
DEFINED EDGE
TYPICAL OF CARCINOMA
MED-LARGE (PERIM)$^2$ / AREA
HIGHLY
SPICULATED
TYPICAL OF CARCINOMA
LARGE (PERIM)$^2$ / AREA

FIG. 13
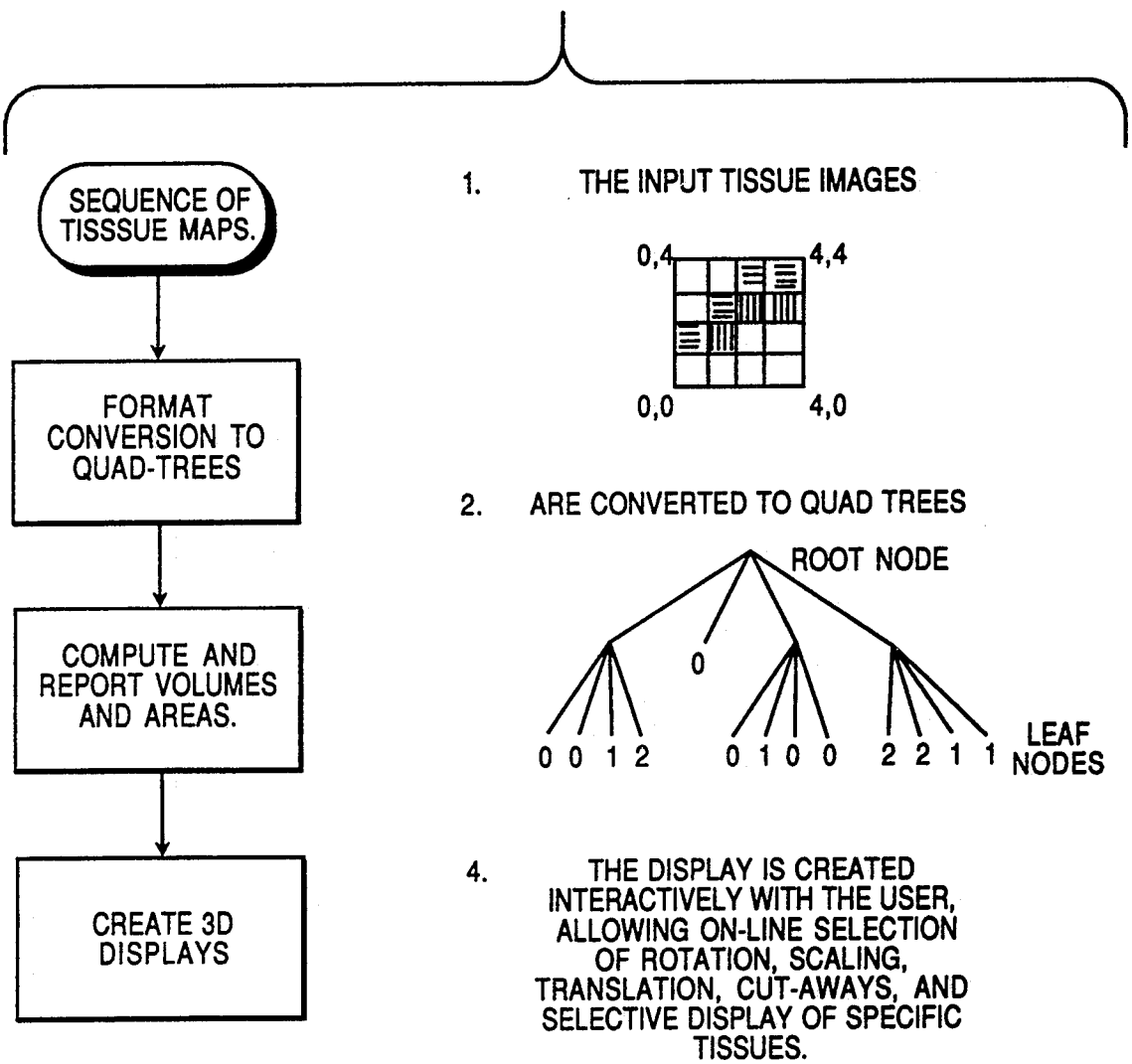
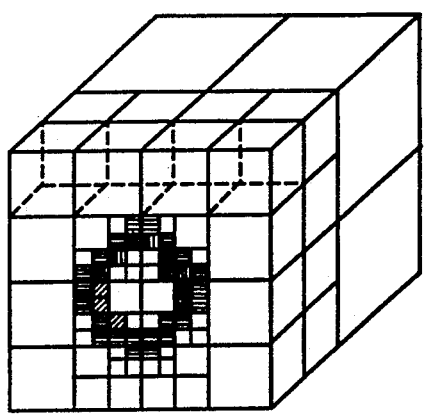

SYSTEM AND METHOD FOR THE NONINVASIVE IDENTIFICATION AND DISPLAY OF BREAST LESIONS AND THE LIKE

This invention relates to the display and identification of breast lesions, including cancer, and similar abnormalities to assist in the medical evaluation thereof.

Breast cancer in women is a great health problem with 130,000 women being diagnosed annually in the U.S. alone. It is the most common malignancy in females and the leading cause of death from cancer among women. Nine percent of American women will be found to have breast cancer in their lifetime. At present there is no means to prevent breast cancer, so the principle method for reducing mortality is early detection and treatment of the disease. Early detection of the disease prolongs life expectancy and decreases the need for total mastectomies. Small tumors which tend to be found early in the disease process do not require complete breast removal. Usually, breast cancer is discovered by palpation followed by mammography. Most breast lesions are benign and especially so in young women. Mammography using x-rays is the present "gold standard" for determining whether the breast lesion is benign or malignant.

Situations in which the present invention is of special value over the "gold standard" method of detecting breast disease is when small lesions within the breast are blocked or masked by other structures during the x-ray procedure. An example of this is a small lesion located behind a large breast prosthesis. Other cases where mammography fails includes disease in the axilla region, disease within a dense glandular breast (normal young women), and cancer within a fibrocystic breast. In these instances, mammography is usually insufficient as a diagnostic tool.

The present invention utilizes magnetic resonance (MR) and analyzes the images using statistical methods and pattern recognition techniques to identify the lesions and provide an image thereof. One of the most important aspects of the invention is that it provides an automated system for the identification of the lesion and quantification of its spatial extent. With this information, the physician can best determine what if any treatment should be provided and, if surgery is necessary, a better understanding of the location and extent of the cancer in the breast.

The system and method of the invention also may be used to monitor the effects of chemotherapy and similar treatments to determine their effectiveness.

One of the many advantages of using the present invention with MR images is that there are no known biological risks associated with MR imaging and multi-section three dimensional (3-D) imaging. MR imaging can be used to precisely locate a lesion in three dimensions. This is important in performing a biopsy or planning for surgery. Since mammography uses projection images, a precise location of the lesion is only accomplished by needle insertion followed by a confirming radiograph.

Another important advantage of the present invention is that multidimensional overlapping image data sets can be obtained with different pulse sequences. These data sets permit the characterization of soft tissue.

While the invention is specifically applicable to MR it is to be understood that the principles may be utilized for other imaging techniques such as positron emission tomography (PET).

Using the invention, breast lesions are statistically separated from normal breast tissue preferably by using the Fisher Linear Discriminate Classifier. The minimum set of parameters to provide separability between fibroadenomas, cysts, and carcinomas within magnetic resonant images of breast tissue are $T_1$ weighted, $T_2$ weighted, and Dixon opposed (DIXOP) pulse sequences.

The pattern recognition routines used on the breast image sets discriminate between fatty, fibrous, cancerous and cystic tissue classes.

Still further, through a refinement technique, the surface of the lesion is described and permits a separation between lobular shaped and spiculated shaped ductal carcinoma.

MR provides multidimensional (or multispectral) imagery due to the operator's ability to control extrinsic pulse sequence parameters. This ability to control pulse sequence parameters means that different tissue characteristics, as well as structural and functional information, can be emphasized. However, the radiologist is presented with a vast array of individual images which involve pulse sequences for each of a series of slice positions. They can number easily between 50 and 100 images. It is very difficult for the radiologist to mentally synthesize all of the information provided by such an image database.

The present invention permits the effective utilization of this information and synthesizes the image database information into a reduced number of "high information content" images which provide information that is readily usable and also helpful to others than the radiologist such as the attending physician, the surgeon and the patient.

While the primary use of the invention is directed to pattern recognition which classifies breast tissues, the invention can also be utilized to evaluate diseases and other tissues. As an example, the evaluation of breast cancer metastases located outside the breast itself is one possible application.

The techniques required to combine and exploit this information from different pulse sequences of breast lesions will become clear and other various objects and advantages will become apparent with reference to the following description including the accompanying drawings, in which:

FIG. 3 shows a flow chart of the preprocessing steps in the invention;

FIG. 4 is a flow chart showing in greater detail the steps utilized in attenuating artifacts;

FIG. 5 shows a brief flow chart of the steps utilized in classifier training;

FIG. 6 shows a short flow chart of the steps utilized in classifying unknown lesions;

FIG. 7 shows a cluster plot demonstrating sample classes and discriminant lines for Fisher Linear Classifier;

FIGS. 9 and 10 show different examples of typical lesion types including polar plots thereof;

Figure 12A:
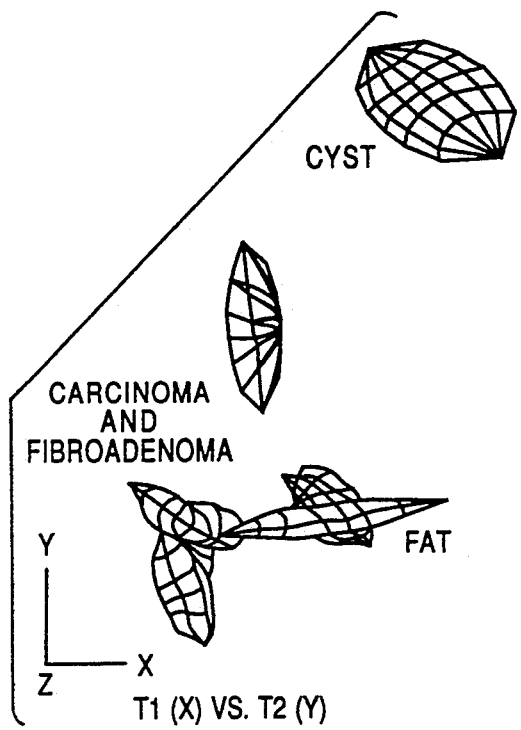
Figure 12B:
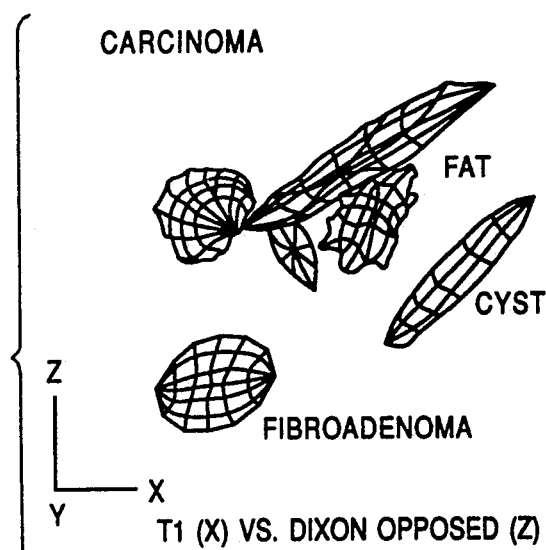
Figure 12C:
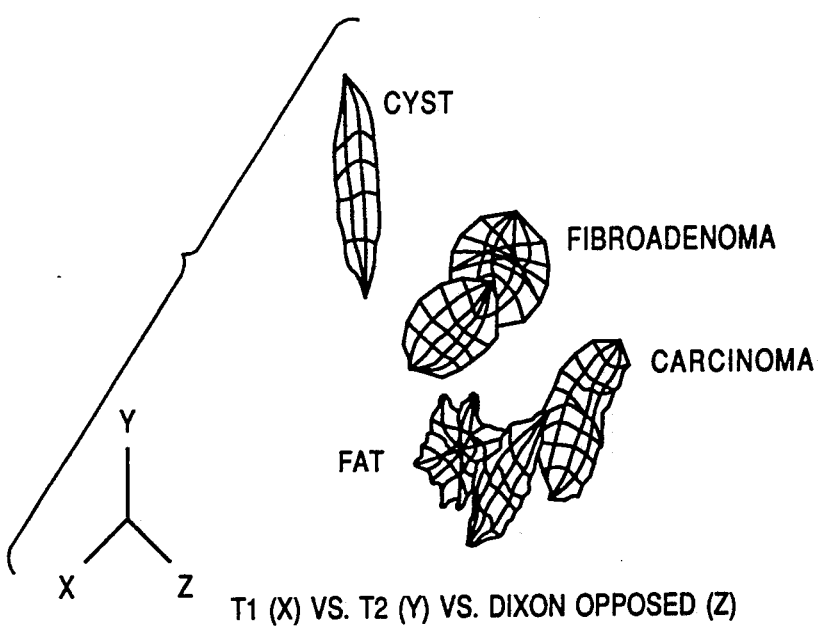

FIGS. 12(A), 12(B), and 12(C) show three-dimentional (3-D) plots of the data statistics; and FIG. 13 shows a flow chart of the 3-D quantification and display utilizing conversion of tissue images to a quad tree representation of a lesion.

Figure 1:
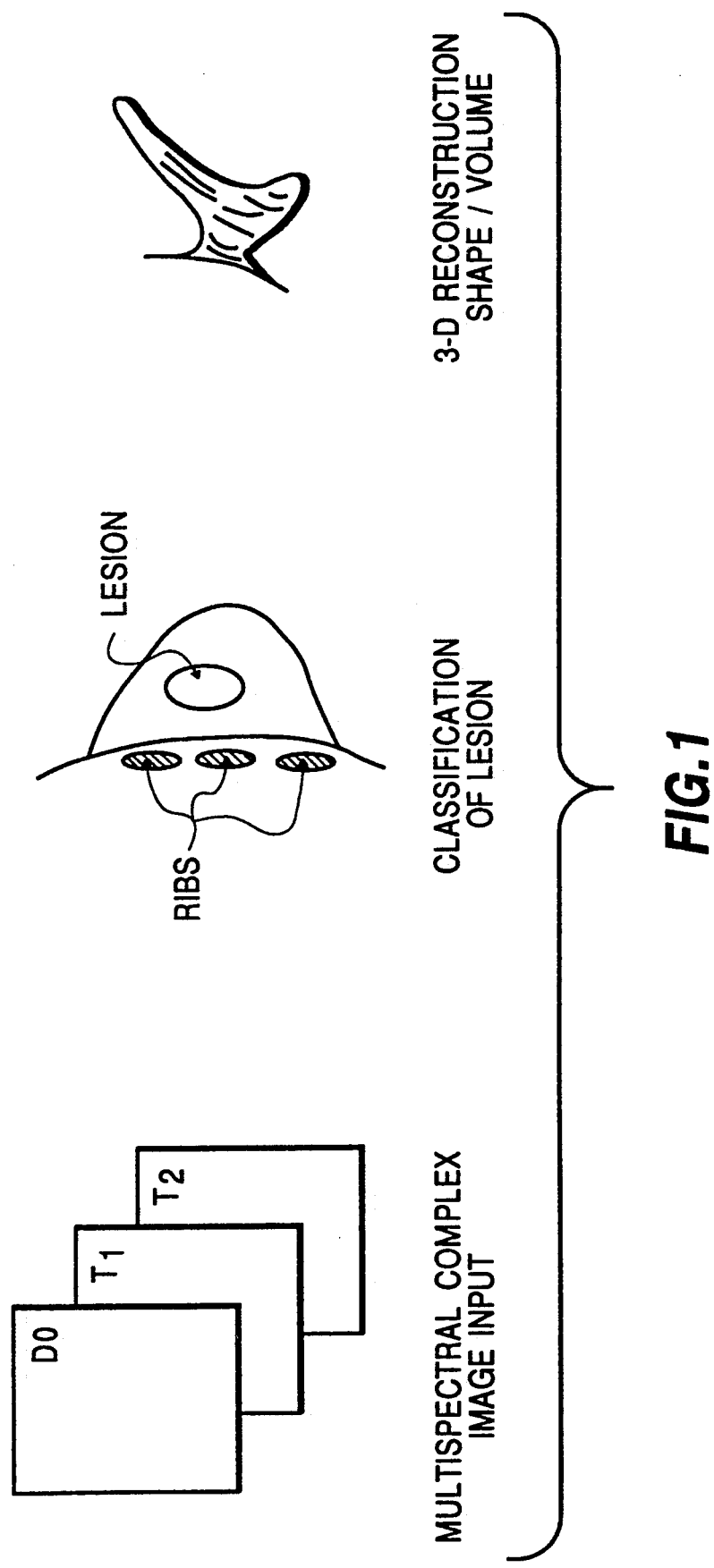
FIG. 1 shows the general identification and display scheme of the breast disease analysis.

With reference to FIG. 1, there is shown an overview of the general identification and display scheme involving three major steps. The first step is to obtain a multispectral complex set of images to input into the procedure. For breast lesions, these images are primarily $T_1$ weighted (TR=500 ms, TE=17 ms), $T_2$ weighted (TR=2000 ms, TE=134 ms) and Dixon opposed (DO) (TR=2000 ms, TE=34 or 68 ms).

This multispectral data set is then processed to classify the lesions using supervised pattern recognition protocols.

The last major step is a three-dimensional (3-D) reconstruction from the classified slices. The shapes and volume of the lesions are useful for surgical planning and monitoring patient response to therapy.

Figure 2:
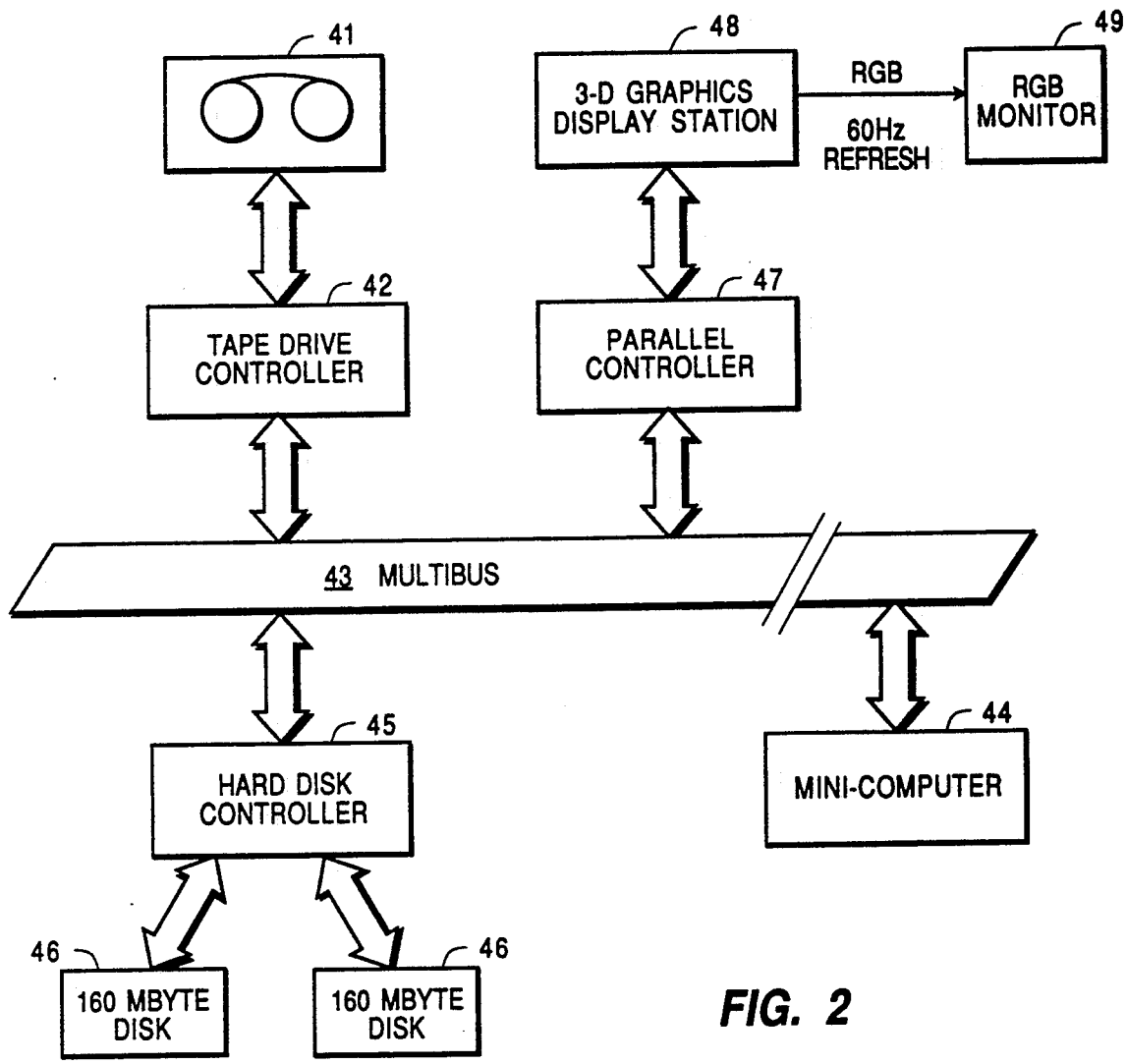
FIG. 2 shows a block diagram of the components of the apparatus used in the invention.

With reference FIG. 2, there is shown a block diagram of the major components of the apparatus used in the invention. A Siemens one Teslar Magnetom Imager with Siemens' software, including reconstruction software, available from Siemens Medical Systems, Inc., 186 Wood Avenue, South Iselin, N.J. 08830, is patient's breast.

A breast surface coil, also from Siemens is used to improve the resolution of the signal. The surface coil container is cylindrical in shape with a 10 cm depth and a 14 cm diameter. The two winding receiver coil encircles the cylinder. Patients with suspected breast disease lie prone with the breast to be diagnosed suspended in the coil.

At the present time, a set of approximately 27 images are made of the breast. The first nine images are an extensive series of $T_1$ weighted (TR=500 ms, TE=17 ms) coronal slices through the breast used to roughly locate the lesion. Six pulse sequences, for each of three slice positions (one near the center of the lesion and one to each side), are then used to generate the remaining coronal images. These include a $T_2$ weighing (TR=2000 ms, TE=134 ms), two intermediate weightings (TR=2000 ms, TE=60 or 94 ms), a proton (spin) density weighting (PD) (TR=2000 ms, TE=30 ms), and two Dixon opposed (Dixop or DO) sequences (TR=2000 ms, TE=34 or 68 ms). In actual practice of the invention for breast lesions, only $T_1$, $T_2$ and Dixop are essential.

Slice specifications for the images: slice width=8 mm and space between slices=12 mm center to center leaving a 4 mm gap. Future work will have slice widths =5 mm and space between slices =7 mm center to center leaving a 2 mm gap.

The image series is recorded on magnetic tape and then transferred to a Winchester hard disk in a Masscomp MC-5520 computer (Massachusetts Computer Corporation, Westford, Mass.) based image processing system. The original images (256 by 256 pixels) are mapped from 12 bits per pixel to 8 bits per pixel to accommodate the display equipment. This mapping procedure causes no visual degradation to the image quality nor to the image statistics.

Next, a square region (128×128 pixels) which completely encloses the breast area is selected and extracted from each of the original images. All further processing is applied to the extracted images.

The apparatus shown in FIG. 2 in block diagram shows the magnetic tape in a tape drive 41 and tape drive controller 42 which is connected to the multibus 43. Hard disk memories 46 each having a capacity of 160 megabytes are also connected to the multibus through hard disk controller 45. The multibus serves the Masscomp MC-5520 mini computer 44 which has two megabytes of memory and 400 megabytes of disk storage. It operates using a Unix ® real time operating system available from AT&T Corporation.

Further connected multibus by means of a parallel controller 47 is a 3-D graphics display station 48 driving an RGB monitor 49 through an RGB 60 hertz refresh. The display station is a Lex 90/35 Model 2.2 display with Solid View firmware and is available from Lexidata Corporation, 755 Middlesix Turnpike, Billerita, Mass. 01865. The computer operation can be integrated into a single unit rather than distributed between the minicomputer and graphics display station.

Most of the equipment of this invention and many of the procedures involved in this invention relate to that disclosed in copending application Merickel et al entitled "NON-INVASIVE MEDICAL IMAGING SYSTEM AND METHOD FOR THE IDENTIFICATION IN 3-D DISPLAY OF ATHEROSCLEROSIS AND THE LIKE," filed Nov. 6, 1987 in the United States Patent and Trademark Office Ser. No. 117,508. That application now issued as U.S. Pat. No. 4,945,478 is commonly owned with the present application and such application and information contained therein including reference to other literature sources are all incorporated by reference and made a part hereof. Also, any reference to literature sources for supplemental information or otherwise made in this application are intended to be incorporated by reference and made a part hereof as supplemental to this disclosure.

With reference to FIGS. 3 and 4, there is shown the pre-processing steps and the steps involved in using the pre-processed images for artifact attenuation.

The images corresponding to a slice sequence through the center of the lesion is selected from the original images.

Minor misregistrations between the various pulse sequence images sometimes occurs due to patient movement during image acquisition so the next step is to align the images to correct the misregistration. The images are taken two at a time and superimposed upon one another in two of the three color frame buffers in the image display system. If the images are misaligned, they are shifted by whole pixels in the horizontal and/or vertical directions until an optimum visual registration is achieved. Landmarks used for the purpose of alignment include the breast edge, the duct system, the lesion, and the pectoral muscle.

Once these images are aligned, they are processed to attenuate the coil artifact in a subroutine shown in FIG. 4. The surface coils used as receivers in the MR imaging in order to improve the signal-to-noise ratio have an associated sensitivity profile which causes the intensity of pixels to fall off with increasing distance from the coil. The sensitivity profile distorts grey level intensity values and must be attenuated before tissue characterization can be attempted. Several techniques have been used to attenuate surface coil artifacts but the preferred one used by this invention assumes that the observed image is composed of the product of the tissue characteristic intensity for the given pulse sequence and the sensitivity profile of the surface coil (see Haselgrove et al, An Algorithm for Compensation of Surface Coil Images for Sensitivity of the Surface Coil. In Magnetic Resonance Imaging 4:469 to 472 (1986) and Noever et al, Detail Visibility Enhancement in Surface Coil Images. Proceedings of the SMRM Annual Meeting: Magnetic Resonance Imaging, 4:97-99, (1986)).

The surface coil gradient artifact is attenuated using only the original images as input and by approximating the surface coil intensity profile. This estimation is accomplished by low pass filtering (smoothing) the original images. The new automated correction procedure for the images containing surface coil artifacts is a three step routine. The routine combines taking a threshold of the image, processing it through median filter and then dividing each original image on a pixel by pixel basis by its low passed counterpart as shown in FIG. 4.

First, the input image is thresholded by taking the $T_1$ weighted breast image and setting the threshold on the low intensities of the image (which is user specified). A value of one standard deviation unit below the frame average is used as a threshold value. All pixels with intensity values less than or equal to the threshold value are set to the threshold value. The thresholding succeeds in lightening very dark regions (i.e., tumor interiors or background) within the divisor image prior to filtering.

The threshold images are then smoothed with the median filter. The median filter retains edge information around regions which are similar in size, or larger than the mask value. This property is beneficial for maintaining pixel values near edges. The mask used for median filtering is $11 \times 11$ pixels in size.

The original images are divided on a pixel by pixel basis by the smooth thresholded images. The pixels in the resultant images are then ready for rescaling and normalizing which is the next step as shown in FIG. 3.

The average intensity of slices fall off with distance from the surface coil which require all the slices belonging to the sequences to be normalized to on another. Intensity normalization between slices is accomplished by identifying corresponding regions in each image of at least one known tissue. The tissue selected for normalization of other breast images is an area of pure fat tissue. All of the images are then set so that pure fat tissue in each image has the same intensity level which is then used as the reference to normalize the remaining areas of the images. Breast tissues are primarily composed of fat and fat should be the same intensity no matter where it is located.

The rescaling step is necessary because when the coil artifact is attenuated, a division procedure is used which divides the original intensity value. So it is rescaled to the original intensity range.

With reference to FIGS. 5, 6 and 7, there is shown the steps necessary in pattern recognition with a supervised classifier. In classifier training, the first step is to create a training data set to train the classifier with examples of pure tissue types, such as fat, cyst and cancer. These tissue examples are chosen with the aid of expert radiologists as very good examples of the expected tissue types. This is then used to determine the classifier parameters preferably using a Fisher Linear Classifier.

It is important to make the distinction that the training of the classifier is done on a separate set of data from the image that is used to diagnose a patient and also that the present invention uses quantitative measures to determine pulse sequences in an automated system that in a stepwise fashion is able to do the processing such as gradient removal and classification to end up with a 3-D model of the lesion.

These classifier parameters from the training data set (FIG. 5) are used to determine the discriminant planes parameters when classifying unknown data sets as shown in FIG. 6. The various classes such as benign, malignant and unknown or any other chosen classification that is capable of being utilized by the technique.

The basic approach employed in this invention in classifying the lesions initially is similar to the paradigm utilized in the copending patent application of Merickel et al, *supra*. This invention initially quantifies the separability provided by different combinations of pulse sequences and prefers the use of Fisher Linear Classifier(s) for classifying the major breast lesions. (For Fisher Linear Classifier(s) classifier also see R. C. Gonzales et al; Pattern Recognition Principles; Addison Wesley Publ. Co., Reading, Mass. (1974) and R. O. Duda et al; Pattern Classification and Scene Analysis; Wiley-Interscience, John Wiley and Sons, New York, N.Y. (1973).) Other classifiers such as minimum distance to the means can also be utilized.

Separability is defined as the ability to differentiate between sets of objects. For statistical pattern recognition to be feasible, the data being examined must exhibit separability between classes and similarity within a class. The automated identification of different breast lesions of the present invention has involved the initial quantification of the separability between the classes of interest in a statistical fashion.

A Mahalanobis distance measurement is the technique employed to test for separability.

The Mahalanobis distance ($r_{ij}$) is defined as:

$$r_{ij} = (m_i - m_j)^T C^{-1} (m_i - m_j)$$

where $m_i$ and $m_j$ are the mean vectors for classes i and j respectively, and $C^{-1}$ is the inverse pooled covariance matrix for classes i and j.

The mean vectors and covariance matrices are direct measurements of the intensity values and their covariances from pixels in selected regions of interest (ROI).

Figure 11:
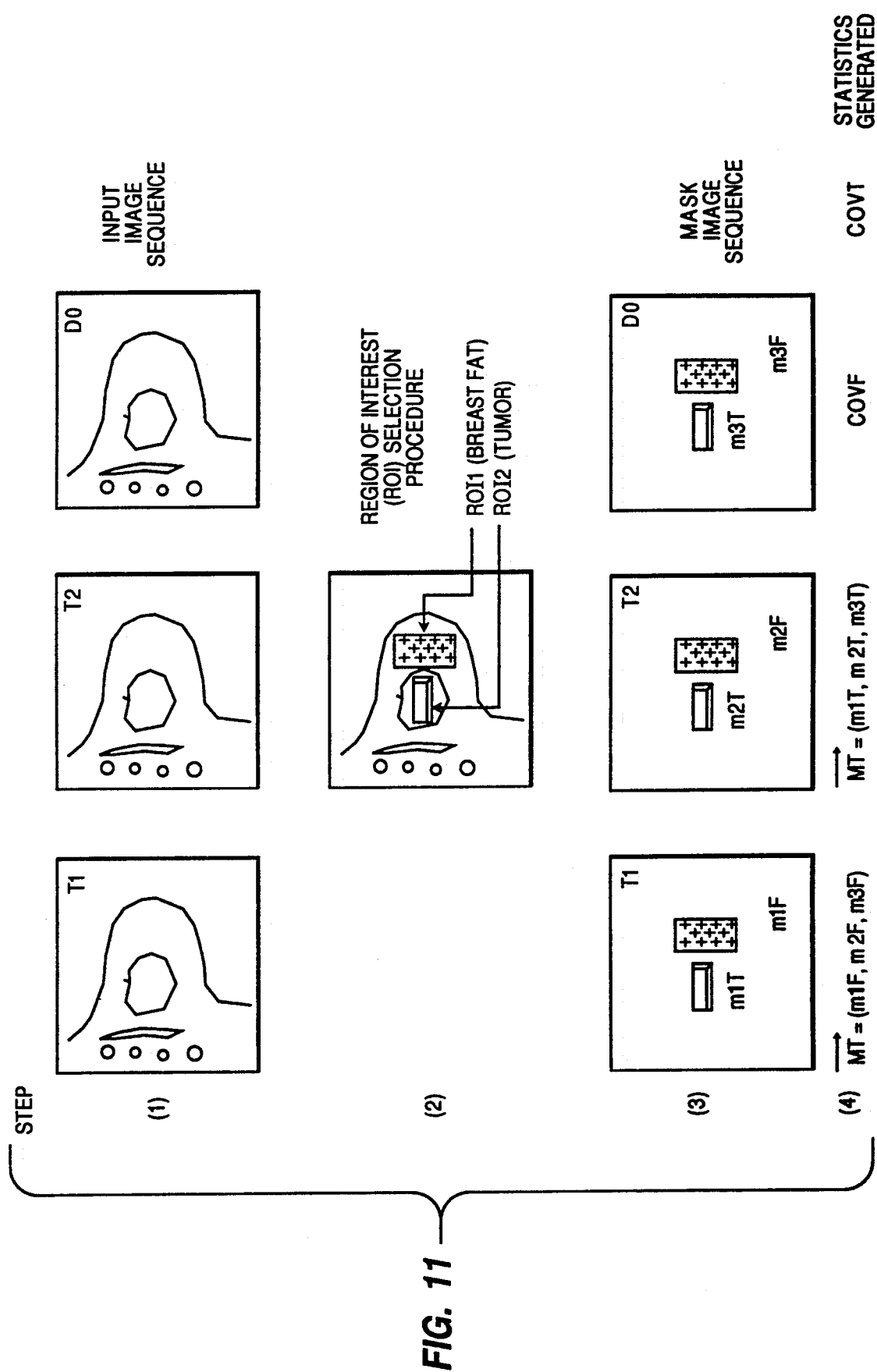
FIG. 11 shows a procedure for generating the statistics.

The procedure for generating the statistics is summarized in FIG. 11. The ROI is chosen by using a mouse and cursor to outline areas. The main criteria for an area to be chosen is homogeneity. This minimizes noise pixels and pixels from different classes than the one presently being examined within a region and generates clean statistics for each class. The mean intensity of each area for each image in a sequence is calculated. When these values are collected in vector format, the result is a mean vector composed of the average pixel intensities for a class of tissue in an image sequence. The covariance matrix is generated from the same region data used to calculate the means.

FIG. 11 shows four steps; the first step are the three input image sequences using $T_1$ weighted, $T_2$ weighted and DO images. The second step involves outlining the areas or regions of interest (ROI) and for simplicity, there are only two shown, ROI1 for breast fat (F) and ROI2 for tumor (T). The third step involves extraction of the areas of interest from the three input image sequences. In the FIGURES, "m" stands for the Mahalanobis distance. The fourth step involves generation of tissue class statistics. The "M" stands for mean, and the "F" and "T" stand for fat and tumor, respectively. The COVF is equal to the covariance matrix for the fat and likewise COVT is equal to covariance matrix for the tumor.

The Mahalanobis distance measure is used to test if the population mean vectors differ significantly. The Mahalanobis distance is distributed as a Hotellings' $T^2$ statistic which, in turn, is distributed as an F statistic multiplied by a coefficient (see Johnson et al; Applied Multivariable Statistical Analysis, Englewood Cliffs, N.J.: Prentice-Hall, 1982). Thus, the separation between two groups are tested using the Mahalanobis distance, an F test, and a chosen confidence level. The protocol for testing tissue separability is: 1) generate the Mahalanobis distance, 2) convert the Mahalanobis distance to an F statistic, 3) select a confidence level, and 4) compare the F statistic to the F table value. If the F statistic is larger than the F table value, it is concluded that the distance between the class clusters is sufficiently large for statistical separation. If the F statistic is smaller than the F table value, it is concluded that the class clusters overlap and that they cannot be statistically separated.

The results of the Mahalanobis distance calculations are summarized in Table 1. Those distances less than 11.34 are inadequate for separability.

TABLE 1

Mahalanobis distances between breast Tissue samples.

| | Breast Fat | Fibro-adenoma | Infiltrating Medullary carcinoma | Ductal Carcinoma | Cyst |
|---|---|---|---|---|---|
| (1) Breast Fat | | | | | |
| $T_1$ | 0.08 | 24.84 | 31.08 | 13.56 | 14.02 |
| $T_2$/Dixop | 0.75 | 16.02 | 0.52 | 7.01 | 252.48 |
| PD/Dixop | 0.90 | 15.36 | 10.73 | 9.20 | 247.75 |
| All | 1.76 | 47.30 | 78.99 | 103.53 | 527.17 |
| (2) Fibroadenoma | | | | | |
| $T_1$ | | 0.00 | 0.40 | 2.10 | 68.79 |
| $T_2$/Dixop | | 0.00 | 10.41 | 15.73 | 85.10 |
| PD/Dixop | | 0.00 | 14.30 | 14.27 | 100.36 |
| All but Dixop | | 0.00 | 4.09 | 9.63 | 196.01 |
| (3) Medullary Carcinoma | | | | | |
| $T_1$ | | | 0.00 | 1.65 | 166.33 |
| $T_2$/Dixop | | | 0.00 | 1.32 | 132.54 |
| PD/Dixop | | | 0.00 | 0.41 | 227.86 |
| All | | | 0.00 | 7.94 | 341.17 |
| (4) Infiltrating Ductal Carcinoma | | | | | |
| $T_1$ | | | | 0.00 | 85.96 |
| $T_2$/Dixop | | | | 0.00 | 86.23 |
| PD/Dixop | | | | 0.00 | 138.77 |
| All | | | | 0.00 | 257.78 |

This table shows the Mahalanobis distance from one tissue, named in the section heading, to other tissues for various combinations of pulse sequence data. From these summaries, determinations are made of the effectiveness of different pulse sequences for separating the data classes, the number of sequences needed to successfully separate the data, and which data classes are not statistically separable. This provides a good indication of the relative importance of different pulse sequences for successful statistical pattern recognition.

The Mahalanobis distances between breast fat and other breast tissues, lesions as well as normal tissue, are shown in Table 1, Section 1. Two main points are shown by this section. First, the invention's artifact removal and tissue normalization procedures are adequate. The evidence of this is the interpatient inseparability of breast fat which indicates a good normalization between individuals. Second, automated pattern recognition on breast data requires $T_1$ weighted images in the analyzed sequences. Only the sequences containing $T_1$ weighted data consistently provides significant separation between breast fat and breast lesions. The fat is bright (high pixel values) while the lesions are dark (low pixel values) in the $T_1$ weighted data. With other weightings such as $T_2$ or proton density (spin density), the breast fat is nearly isointense with many lesions and therefore not statistically separable from the lesions.

Section 2 lists the Mahalanobis distances between a fibroadenoma and other breast lesions. From this section, it is seen that $T_1$ weighted images are insufficient for differentiating fibroadenomas from carcinomas. However, fibroadenomas and carcinomas are separated by including Dixon opposed images (Dixop or DO) in the classifier input sequence which provides statistical discrimination between the fibroadenomas and carcinomas.

Section 3 shows that medullary carcinoma and infiltrating ductal carcinoma cannot be statistically separated. Pixel intensities on magnetic resonance images are insufficient as a separation criteria between these cancers. Thus, these two types of cancer are combined initially into a single cancer class.

Sections 3 and 4 contain the Mahalanobis distances between cysts and carcinomas. Cysts are readily separated from all other breast tissues. They show up as very bright on $T_2$ weighted images (brighter than breast fat) due to their high free water content.

From the Mahalanobis distance calculations, it is shown that the three pulse sequences used by the inventors are adequate for statistically separating MR images of breast fat, cyst, carcinoma and fibroadenoma. These three pulse sequence inputted into the statistical classifier result in a sequence containing 1) a $T_1$ weighted image, 2) a $T_2$ weighted image, and 3) a Dixon opposed image.

One method of viewing separability among classes is through the use of multidimensional cluster plots of class statistics. FIG. 12 shows three orientations of a three dimensional plot ($T_1$ weighted, $T_2$ weighted and Dixon opposed) of the tissue statistical data. Each ellipsoid in the plot represents a unique tissue sample and is centered at the multidimensional mean for that sample. The length of each ellipsoid axis corresponds to one standard deviation unit (sigma unit) from its corresponding cluster mean.

From these plots, the separations which were measured with the Mahalanobis distance procedure can be visualized. FIG. 12A shows three clusters corresponding to breast fat, cyst, and fibroadenoma-carcinoma groups. The cluster plot visually demonstrates the importance of $T_1$ for separating out the breast fat from the other groups, as well as the high $T_2$ value of the cyst pixels. FIG. 12B shows the importance of the Dixon Opposed (Dixop) sequence in separating fibroadenomas from carcinomas and fat. FIG. 12C visually demonstrates the separation of the data into four distinct clusters when the three dimensions ($T_1$ weighted, $T_2$ weighted, and Dixop) are combined. Fat, fibroadenoma, carcinoma, and cyst groups are classified with statistical pattern recognition procedures.

Two methods of pattern recognition, the minimum distance to the means (MDM), and the Fisher linear classifier (FLC), have been used on preliminary data. The MDM classifier uses a Euclidean distance measure in determining a class assignment for a given pixel. The MDM merely assigns a pixel to the closest available class based on the difference between that pixel and the class mean vectors. The FLC, on the other hand, uses a discriminating function which incorporates the mean vectors of two classes, and their pooled covariance matrix. It maps a multivariate distribution to an optimal univariate distribution and separates the classes based on the midpoints between the univariate distributions.

Both classifiers generate satisfactory results. The classifiers exhibit successful recognition of regions corresponding to normal breast fat, breast carcinoma, and fibrous or mixed tissues. The MDM generates a broader classification than the FL classifier resulting in thicker boundaries between tissue classes. Since the FL classifier uses variance data as well as mean values in its determination of class membership, tissue edges are more clearly defined and this is the classifier preferred for use in the invention.

A 3-D cluster plot demonstrating sample classes and discriminate lines (dotted) for the Fisher linear classifier is shown schematically in FIG. 7 utilizing the three images $T_1$ weighted, $T_2$ weighted and Dixon opposed and using the simplified classification of malignant, benign and unknown for the schematic representation of the classification.

Figure 8:
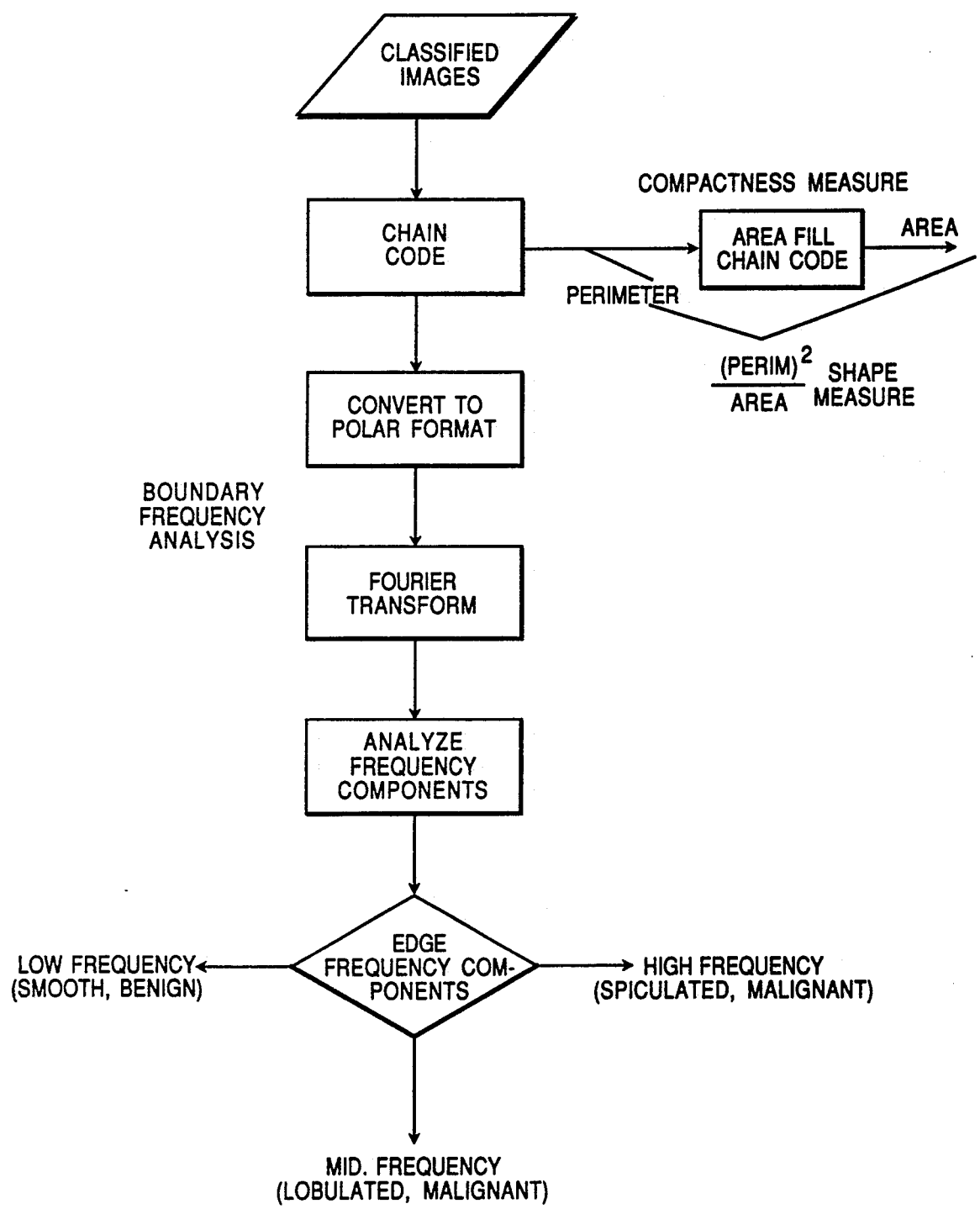
FIG. 8 shows a flow chart of the steps utilized in the refinement process.

With reference to FIG. 8, there is shown a flow chart for the refinement of the information. The refinement procedure is predominantly composed of procedures to characterize the shape of the lesion. First, the lesion edge is chain coded. The length of the perimeter and the area within the perimeter are determined.

One shape measure, the right branch of the chart, shows the use of a perimeter (perim) squared divided by area calculation. The smaller the value the less jagged the edge and the greater the roundness of the lesion in question.

The left branch of the chart indicates the Fourier descriptor protocol. The lesion edge is converted to polar format and a Fourier transform is applied to the polar values. The frequency components are analyzed as low frequency components and the resultant shows the general size of the lesion and its approximate shape (circular, elliptical). High frequency components measures spiculation and mid-frequency measures lobulation, two indicators of malignancy.

Thus, the lesion edge of classified images is chain coded and the length of its perimeter determined. The area bounded by the chain code is filled and calculated. A shape measure is then calculated (the perimeter squared divided by the area) which gives an indication of shape.

The chain coded lesion edge is then also converted to a polar format to which a Fourier transform is applied and then the frequency components analyzed to determine the edge type such as lobulated, smooth or spiculated.

Figure 10:
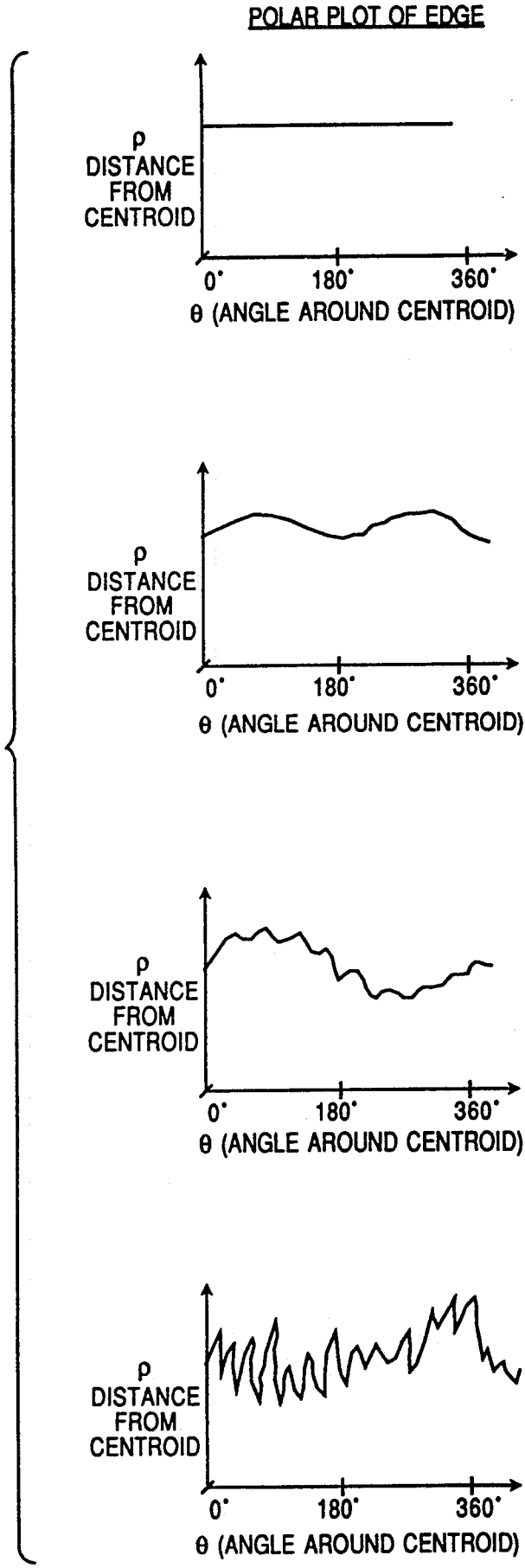

This is shown in a different form in FIGS. 9 and 10 which illustrate different sample lesions of typical lesion types, gives descriptions of the lesions, and shows associated polar plots of the lesion's edge. The first sample is a typical cyst; very round and symmetric with a smooth edge. It has a small ratio for perimeter squared to area. The polar plot of the edge of the lesion in FIG. 10 shows a constant radius around the lesion. This is shown as a polar plot of the edge of the angle around the centroid versus the distance from the centroid.

The second example is typical of a fibroadenoma as it has an asymmetric smooth, well-defined edge with a medium ratio of the perimeter squared to area. The polar plot has only low frequency components.

Third and fourth examples show edges that are typical of carcinoma. They are asymmetric, have ill-defined borders and are jagged or "crab-like" along the edges. It is to be recalled that cancer stems from the word "crab." The third example is lobulated and has a medium-large (med-large) ratio of the perimeter squared to the area. The polar plot shows a moderately high frequency of components which are somewhat lobulated. The fourth example has a highly spiculated edge with a large ratio of perimeter squared to area. The polar plot has a high frequency of spiked components.

More specifically, this refinement permits a differentiation between shape types of lesion which is helpful to the physician.

Basically, the refinement step is a shape measuring step and is able to distinguish between lesions that could not be statistically separated and categorized. Of course, any determination of cancer or suspicion of cancer is confirmed by a biopsy. So far, the invention has never shown a false negative or a false positive.

The chain coding is a procedure by which an edge can be described and is well known in image processing. See: Gonzales & Wirtz; Digital Image Processing, Second Edition, Addison-Wesley Publishing Co., Reading, Mass. (1987).

Initially, the $T_1$, $T_2$ and Dixop sequences have their information combined so that one image is used to do the chain coding. Since only suspect lesions are of interest, the benign lesions are usually not refined. The area is filled in within the chain coded region in order to get an exact measurement of the area that the lesion occupies. If the perimeter is squared divided by the filled-in area, this gives a shape measure and an indication of how circular the region is. A cyst is very circular, so the lesion is very close to a circular measurement, and the statistical measurements are consistent with cysts, so it may be classified as a cyst.

The other type of shape measure, as already mentioned, uses a polar format and Fourier transform. At the present time, the periphery or boundary to area ratio is being determined by a two-dimensional analysis on a single slice. The analysis also may be made by using three-dimensional images in which case it will be area of the periphery or boundary of the shape as compared to the volume of the shape contained within the periphery or boundary to indicate the type of lesion running from a truly spherical which is similar to a cyst to a spiculated shape which would be carcinoma or in between can be lobulated as another type of carcinoma from the standpoint of shape.

The shape of the lesion is very important to a radiologist. Usually a lesion with a lobulated ill-defined edge or highly spiculated edge is diagnosed as malignant whereas a lesion with a smooth, well-defined edge usually indicates it is not malignant.

The procedure for the classification and refinement stage is followed by the 3-D reconstruction of the shape and volume.

With reference to FIG. 13, there is shown a basic flow chart of the means of quantification and display of the lesion. This draws heavily upon similar techniques more fully set forth in Merickel et al pending application, *supra*. First, a sequence of tissue maps showing the lesion in question are formatted and converted to quad trees. These are then computed and reported as to volumes in areas, then a 3-D display is created.

More specifically, a format of the classification result from a two-dimensional array of tissues classes is converted into a quad tree. This process involves starting with the input image as the active area, and recursively subdividing the active area into four quadrants, making each the active area in turn, until the active area consists of a homogeneous region, i.e., all pixels in the region have the same value. At this point, the value of the pixels and region is stored in a leaf node of a quad tree data structure and the next quadrant is made the active area until all quadrants have been examined. In the second step, the quad tree formatted data is processed by a program which computes the volumes of tissue type in each slice. The volumes and areas can then be computed if desired. They are very helpful in determining the effect of therapy as to whether the lesion is shrinking, growing or remaining at the same size.

The 3-D display program used in the quad tree data and input allows the user to specify any rotation, scaling, and translation (RST transformation) of the 3-D object for display, and the program will generate the appropriately shaded display as the user waits. Because the quad tree is a hierarchal structure, the program only has to apply the RST transformation once, to the root node of the tree, and the transformed positions of the quadrants can be computed from their parent's position. The display program also may make use of the surface shading and hidden surface removal capabilities of the Lexidata display device, sending it only the 4 D values for the vertices (x, y, z and intensity) of each of the faces that are visible for each leaf node in the quad tree. A leaf node in a quad tree correspond to one or more pixels in the original image. Thus, the 3-D displays of the lesion in question are created.

There is thus described an image processing, pattern recognition and 3-D graphical display system and method that permits a noninvasive evaluation diagnosis of lesions in female breast using MR imagery. This enables a determination of whether or not breast cancer is present and if so, its location and extent to better enable the performance of a biopsy and surgical planning. It also presents a means of following the progress of any treatment of the cancer.

A key concept in the invention is the classification of the lesions both using statistical techniques and shape analysis techniques. These techniques are essential to exploit the tremendous amount of information available and the new biomedical imaging modalities such as MR.

While the invention has been described using MR for the input data and has been particularly directed to female breast disease, many aspects of the invention are usable with other noninvasive input data such as positron emission tomography (PET) and ultra sound scans and is also useable for other parts of the body than the female breast.

While a preferred embodiment of the invention has been shown and described, it will be understood that there is no intent to limit the invention with such disclosure, but rather it is intended to cover all modifications and alternate constructions falling within the spirit and scope of the invention as defined in the appended claims.

What is claimed is:

1. A method for the noninvasive determination and display of a body part composed of different tissue types of interest of a mammalian live body where the boundary of said tissue types encloses an area or volume and where the boundary shape is of significance using information obtained from multiple image slices produced by a body scan such as MRI or PET comprising the following steps:

produce multiple sequences of image slices by noninvasive scanning a mammalian body;

classify at least some of the different tissue types in said body part by comparing by computer said tissue types in said image slices to classifier parameters of said tissue types created by data obtained from other similar mammalian bodies;

determine the boundary shape of one or more of said tissue types of interest which have been classified; and display said one or more tissue types of interest including the boundary shape thereof.

2. The method of claim 1, wherein said body part is a human female breast with said classification step classifying the tissue types into fat, fibroadenoma, carcinoma and cyst and said tissue types of interest include carcinoma.

3. The method of claim 2, wherein the classification step is accomplished by using a statistical classifier.

4. The method of claim 3, wherein said statistical classifier is a Fisher Linear Classifier.

5. The method of claim 3, wherein said body scan is MRI and at least a $T_1$ weighted image, $T_2$ weighted image and Dixon opposed image is made of said image slices.

6. The method of claim 2, wherein said boundary shape is determined as being either smooth, lobulated or spiculated by converting the boundary of said tissue types of interest to a polar format thereof.

7. The method of claim 6, wherein said polar format includes the steps of:

performing a Fourier transform on said polar format to generate a resultant having frequency components; and analyzing the said frequency components of said resultant from said Fourier transform.

8. The method of claim 2, wherein said boundary shape is defined by determining a shape measure based on a ratio of the boundary shapes peripheral length or area to the enclosed area or volume, respectively.

9. The method of claim 1, including the following steps:

reconstructing the shape and volume of said one or more tissue types of interest into a 3-D image by converting the sequence of tissue images to quad trees; and computing and indicating volumes and areas and creating a 3-D display showing the boundary shape of said one or more tissue types of interest.

10. The method of claim 9, wherein:

said body part is a human female breast and said tissue types of interest include carcinoma with said classification step classifying the tissue types into fat, fibroadenoma, carcinoma and cyst;

the classification step is accomplished by using a statistical classifier; and said body scan is MRI and at least a $T_1$ weighted image, $T_2$ weighted image and Dixon opposed image is made of said image slices.

11. A noninvasive imaging analysis system for the display of a body part composed of different tissue types of interest of a mammalian live body where the boundary of said tissue types encloses an area or volume and where the boundary shape is of significance using information obtained from multiple image slices produced by a body scan such as MRI and PET comprising:

an electronic digital storage means for storing said information as well as other information;

a computer for processing said information from said storage means;

a graphics display station for displaying an image resulting from said processed information;

said computer for processing including means for taking multiple sequenced image slices resulting from the body scan and determining the boundary shape of one or more of said tissue types of interest;

means for classifying at least some of said tissue types in said body part by comparing said tissue types to classifier parameters of said tissue types stored in said storage means;

means for determining the boundary shape of one or more of said tissue types of interest which have been classified; and means for displaying said one or more tissue types of interest including its location, size and boundary shape thereof.

12. The system of claim 11, wherein:
said body part is a human female breast with said classifying means classifying the tissue types into fat fibroadenoma, carcinoma and cyst and said tissue types of interest include carcinoma.

13. The system of claim 12, wherein the classification means is accomplished by using a statistical classifier.

14. The system of claim 13, wherein said statistical classifier is a Fisher Linear Classifier.

15. The system of claim 13, wherein: said body scan is MRI which generates at least a $T_1$ weighted image, $T_2$ weighted image and Dixon opposed image of said image slices.

16. The system of claim 12, wherein said boundary shape is determined as being either smooth, lobulated or spiculated by means for converting the boundary of said tissue type of interest to a polar format.

17. The system of claim 16, wherein:
said converting means includes means for performing a Fourier transform on said polar format to generate a resultant having frequency components and analyzing said frequency components of said resultant from said Fourier transform.

18. The system of claim 12, wherein said boundary shape determining means calculates a shape measure based on a ratio of the boundary to the enclosed area or volume.

19. The system of claim 11 where said computer for processing includes:

means for reconstructing the shape and volume of said one or more tissue types of interest into a 3-D image by converting the sequence of tissue images to quad trees; and means for computing and indicating volumes and areas and creating a 3-D display showing the boundary shape of said one or more tissues types of interest.

20. The system of claim 19, wherein:
said body part is a human female breast and said tissue types of interest include carcinoma with said classification means classifying the tissue types into fat, fibroadenoma, carcinoma and cyst which is accomplished by using a statistical classifier; and said body scan is MRI which generates a $T_1$ weighted image, $T_2$ weighted image and Dixon opposed image of said image slices.

* * * * *